(12) United States Patent
Fujino

(10) Patent No.: US 11,676,739 B2
(45) Date of Patent: Jun. 13, 2023

(54) TRANSPARENT ELECTROCONDUCTIVE LAYER, TRANSPARENT ELECTROCONDUCTIVE SHEET, TOUCH SENSOR, LIGHT CONTROL ELEMENT, PHOTOELECTRIC CONVERSION ELEMENT, HEAT RAY CONTROL MEMBER, ANTENNA, ELECTROMAGNETIC WAVE SHIELD MEMBER, AND IMAGE DISPLAY DEVICE

(71) Applicant: NITTO DENKO CORPORATION, Ibaraki (JP)

(72) Inventor: Nozomi Fujino, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/796,980

(22) PCT Filed: Jan. 29, 2021

(86) PCT No.: PCT/JP2021/003398
§ 371 (c)(1),
(2) Date: Aug. 2, 2022

(87) PCT Pub. No.: WO2021/157493
PCT Pub. Date: Aug. 12, 2021

(65) Prior Publication Data
US 2023/0070902 A1 Mar. 9, 2023

(30) Foreign Application Priority Data

Feb. 3, 2020 (JP) .............................. JP2020-016508

(51) Int. Cl.
*H01B 5/14* (2006.01)
*H01B 1/08* (2006.01)
(Continued)

(52) U.S. Cl.
CPC .............. *H01B 5/14* (2013.01); *C01G 19/02* (2013.01); *C23C 14/0036* (2013.01);
(Continued)

(58) Field of Classification Search
CPC .. H01B 5/14; H01B 1/08; C01G 19/02; C23C 14/0036; C23C 14/086; C23C 14/3464; C01P 2006/40
See application file for complete search history.

(56) References Cited

U.S. PATENT DOCUMENTS

2004/0222089 A1* 11/2004 Inoue .................. C23C 14/3414
204/298.12
2008/0050595 A1  2/2008 Nakagawara et al.
(Continued)

FOREIGN PATENT DOCUMENTS

CN    103875042 A    6/2014
CN    105723473 A    6/2016
(Continued)

OTHER PUBLICATIONS

Notification Concerning Transmittal of International Preliminary Report on Patentability (Forms PCT/IB/326) issued in counterpart International Application No. PCT/JP2021/003398 dated Aug. 18, 2022 with Forms PCT/ISA/237. (6 pages).
(Continued)

*Primary Examiner* — Nathan L Van Sell
(74) *Attorney, Agent, or Firm* — WHDA, LLP

(57) ABSTRACT

A transparent electroconductive layer 3 includes a first main surface 5 and a second main surface 6 facing each other in a thickness direction. The transparent electroconductive layer 3 is a single layer extending in a plane direction perpendicular to the thickness direction. The transparent electroconductive layer 3 has a plurality of crystal grains 4, a plurality of first grain boundaries 7 partitioning the plu-
(Continued)

rality of crystal grains 4 and having each of one end edge 9 and another end edge 10 in the thickness direction open in each of the first main surface 5 and the second main surface 6, and a second grain boundary 8 branching from a first intermediate portion 11 of one first grain boundary 7A and reaching a second intermediate portion 12 of another first grain boundary 7B.

11 Claims, 5 Drawing Sheets

(51) Int. Cl.
*C01G 19/02* (2006.01)
*C23C 14/00* (2006.01)
*C23C 14/08* (2006.01)
*C23C 14/34* (2006.01)

(52) U.S. Cl.
CPC ........ *C23C 14/086* (2013.01); *C23C 14/3464* (2013.01); *H01B 1/08* (2013.01); *C01P 2006/40* (2013.01)

(56) References Cited

U.S. PATENT DOCUMENTS

| | | | |
|---|---|---|---|
| 2014/0224317 A1 | 8/2014 | Feist et al. | |
| 2016/0293383 A1 | 10/2016 | Nashiki et al. | |
| 2018/0279471 A1 | 9/2018 | Chen et al. | |

FOREIGN PATENT DOCUMENTS

| | | |
|---|---|---|
| CN | 109073940 A | 12/2018 |
| EP | 3 438 733 A1 | 2/2019 |
| JP | H07-073738 A | 3/1995 |
| JP | H07-150338 A | 6/1995 |
| JP | H09-286070 A | 11/1997 |
| JP | 2000-222944 A | 8/2000 |
| JP | 2008-149681 A | 7/2008 |
| JP | 2012-188711 A | 10/2012 |
| JP | 2014-529185 A | 10/2014 |
| JP | 2015-074810 A | 4/2015 |
| JP | 2017-105069 A | 6/2017 |
| JP | 2018-041059 A | 3/2018 |
| TW | 201630849 A | 9/2016 |
| TW | 201727671 A | 8/2017 |
| TW | 201741731 A | 12/2017 |
| WO | 2007/080738 A1 | 7/2007 |

OTHER PUBLICATIONS

Notification of Transmittal of Translation of the International Preliminary Report on Patentabililty (Form PCT/IB/338) issued in counterpart International Application No. PCT/JP2021/003398 dated Aug. 18, 2022 with Forms PCT/IB/373 and PCT/ISA/237. (6 pages).

International Search Report dated Apr. 13, 2021, issued in counterpart application No. PCT/JP2021/003398 with English translation. (4 pages).

Office Action dated Aug. 16, 2022, issued in counterpart JP Application No. 2021-160979, with English Translation. (8 pages).

Office Action dated Sep. 23, 2022, issued in counterpart TW Application No. 110103936, with English Translation. (13 pages).

Office Action dated Dec. 26, 2022, issued in counterpart TW application No. 110103936, with English translation. (5 pages).

\* cited by examiner

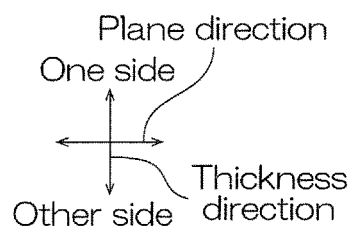
FIG. 1A
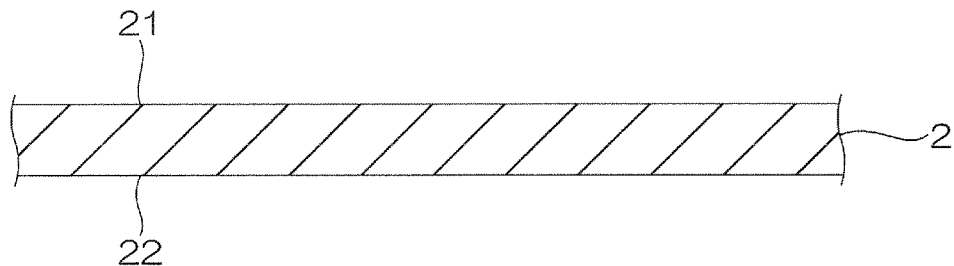
FIG. 1B
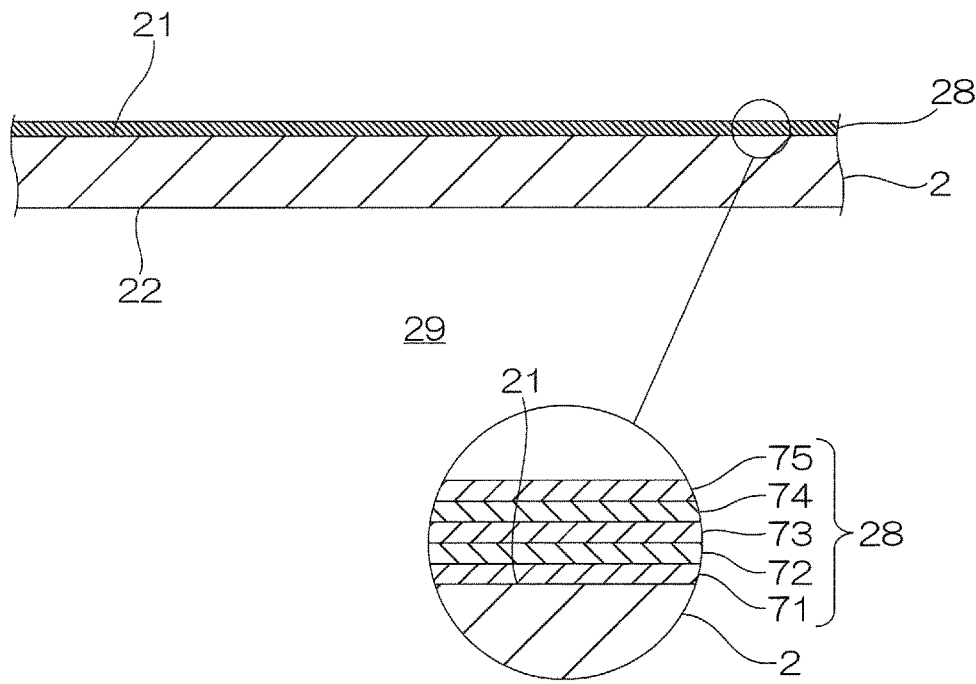
FIG. 1C
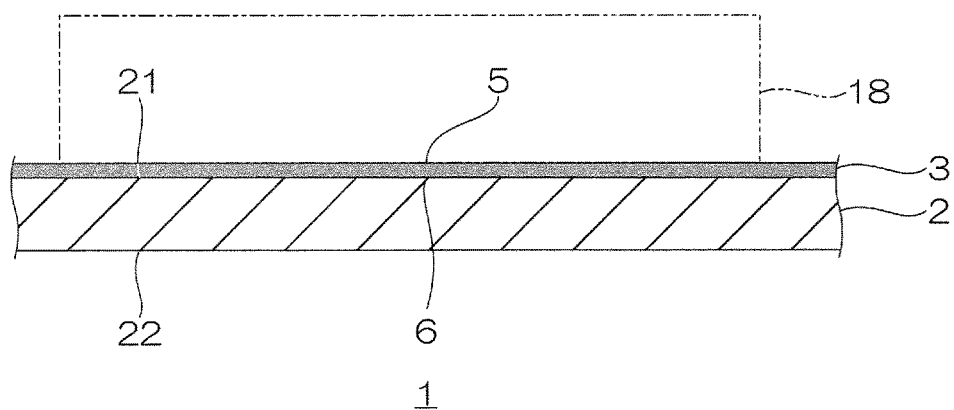

TRANSPARENT ELECTROCONDUCTIVE LAYER, TRANSPARENT ELECTROCONDUCTIVE SHEET, TOUCH SENSOR, LIGHT CONTROL ELEMENT, PHOTOELECTRIC CONVERSION ELEMENT, HEAT RAY CONTROL MEMBER, ANTENNA, ELECTROMAGNETIC WAVE SHIELD MEMBER, AND IMAGE DISPLAY DEVICE

TECHNICAL FIELD

The present invention relates to a transparent electroconductive layer, a transparent electroconductive sheet, a touch sensor, a light control element, a photoelectric conversion element, a heat ray control member, an antenna, an electromagnetic wave shield member, and an image display device.

BACKGROUND ART

Conventionally, a transparent electroconductive sheet including a crystalline transparent electroconductive layer has been known.

For example, a light-transmitting electroconductive film including a light-transmitting electroconductive layer having a plurality of crystal grains has been proposed (ref: for example, Patent Document 1 below).

In a second inorganic oxide layer constituting the light-transmitting electroconductive layer described in Patent Document 1, there are grain boundaries for partitioning the above-described plurality of crystal grains extending from the upper surface to the lower surface of the light-transmitting electroconductive layer.

CITATION LIST

Patent Document

Patent Document 1: Japanese Unexamined Patent Publication No. 2018-41059

SUMMARY OF THE INVENTION

Problem to be Solved by the Invention

Recently, the light-transmitting electroconductive layer used in touch panels, solar cells, light control elements, or the like requires lower resistance properties. For the light-transmitting electroconductive layer, it is possible to use an electroconductive oxide such as indium tin composite oxide (ITO), a metal/oxide composite layer obtained by compounding a metal layer with an inorganic oxide layer such as the light-transmitting electroconductive layer described in Patent Document 1, or the like, and the electroconductive oxide having high reliability under the severe environment such as wet heat or the like is particularly preferably used. In order to ensure the low resistance properties using the electroconductive oxide, the crystalline electroconductive oxide is preferably used as the light-transmitting electroconductive layer. On the other hand, the crystalline electroconductive oxide generally has large moisture permeability in a thickness direction. The light-transmitting electroconductive layer is also required to have low moisture permeability, but the application of the crystalline electroconductive oxide poses a problem from the viewpoint of moisture permeability. In other words, the second inorganic oxide layer constituting the light-transmitting electroconductive layer described in Patent Document 1 has a problem that the above-described requirement for low moisture permeability cannot be satisfied.

The present invention provides a transparent electroconductive layer having excellent moisture permeability resistance, a transparent electroconductive sheet, a touch sensor, a light control element, a photoelectric conversion element, a heat ray control member, an antenna, an electromagnetic wave shield member, and an image display device.

Means for Solving the Problem

The present invention [1] includes a transparent electroconductive layer including a first main surface and a second main surface facing each other in a thickness direction; being a single layer extending in a plane direction perpendicular to the thickness direction; and having a plurality of crystal grains, a plurality of first grain boundaries partitioning the plurality of crystal grains and having each of one end edge and another end edge in the thickness direction open in each of the first main surface and the second main surface, and a second grain boundary branching from an intermediate portion in the thickness direction of one first grain boundary and reaching an intermediate portion in the thickness direction of another first grain boundary adjacent to the one first grain boundary.

The transparent electroconductive layer has the second grain boundary that branches from the intermediate portion in the thickness direction of the one first grain boundary and reaches the intermediate portion in the thickness direction of the other first grain boundary adjacent to the one first grain boundary. Therefore, even when water is brought into contact with the second main surface, it is possible to secure a long path of water reaching from the second main surface to the first main surface. As a result, the transparent electroconductive layer has excellent moisture permeability resistance.

The present invention [2] includes the transparent electroconductive layer described in [1], wherein the second grain boundary has, in a cross-sectional view, an apex located at a position 5 nm or more away from a line segment connecting the intermediate portion in the thickness direction of the one first grain boundary to the intermediate portion in the thickness direction of the other first grain boundary.

In the transparent electroconductive layer, since the second grain boundary has the apex, it is possible to make the above-described path of water further longer. As a result, the transparent electroconductive layer has more excellent moisture permeability resistance.

The present invention [3] includes the transparent electroconductive layer described in [1] or [2], wherein a material is a tin-containing oxide.

Since the material for the transparent electroconductive layer is the tin-containing oxide, the transparent electroconductive layer has excellent transparency and electrical conductivity.

The present invention [4] includes the transparent electroconductive layer described in any one of [1] to [3] having a thickness of 100 nm or more.

Since the thickness of the transparent electroconductive layer is 100 nm or more, the transparent electroconductive layer has excellent moisture permeability resistance.

The present invention [5] includes a transparent electroconductive sheet including the transparent electroconductive layer described in any one of [1] to [4] and a substrate sheet located at the side of a second main surface of the transparent electroconductive layer.

Since the transparent electroconductive sheet includes the above-described transparent electroconductive layer, it has excellent moisture permeability resistance.

The present invention [6] includes a touch sensor including the transparent electroconductive layer described in any one of [1] to [4].

Since the touch sensor includes the above-described transparent electroconductive layer, it has excellent moisture permeability resistance.

The present invention [7] includes a light control element including the transparent electroconductive layer described in any one of [1] to [4].

Since the light control element includes the above-described transparent electroconductive layer, it has excellent moisture permeability resistance.

The present invention [8] includes a photoelectric conversion element including the transparent electroconductive layer described in any one of [1] to [4].

Since the photoelectric conversion element includes the above-described transparent electroconductive layer, it has excellent moisture permeability resistance.

The present invention [9] includes a heat ray control member including the transparent electroconductive layer described in any one of [1] to [4].

Since the heat ray control member includes the above-described transparent electroconductive layer, it has excellent moisture permeability resistance.

The present invention [10] includes an antenna including the transparent electroconductive layer described in any one of [1] to [4].

Since the antenna includes the above-described transparent electroconductive layer, it has excellent moisture permeability resistance.

The present invention [11] includes an electromagnetic wave shield member including the transparent electroconductive layer described in any one of [1] to [4].

Since the electromagnetic wave shield member includes the above-described transparent electroconductive layer, it has excellent moisture permeability resistance.

The present invention [12] includes an image display device including the transparent electroconductive layer described in any one of [1] to [4].

Since the image display device includes the above-described transparent electroconductive layer, it has excellent moisture permeability resistance.

Effect of the Invention

The transparent electroconductive layer, the transparent electroconductive sheet, the touch sensor, the light control element, the photoelectric conversion element, the heat ray control member, the antenna, the electromagnetic wave shield member, and the image display device of the present invention have excellent moisture permeability resistance.

BRIEF DESCRIPTION OF THE DRAWINGS

FIGS. 1A to 1C show process cross-sectional views for illustrating a method for producing one embodiment of a transparent electroconductive sheet of the present invention:

FIG. 1A illustrating a step of preparing a substrate sheet,

FIG. 1B illustrating a step of forming an amorphous transparent electroconductive layer, and FIG. 1C illustrating a step of forming a crystalline transparent electroconductive layer.

DESCRIPTION OF EMBODIMENTS

Figure 2:
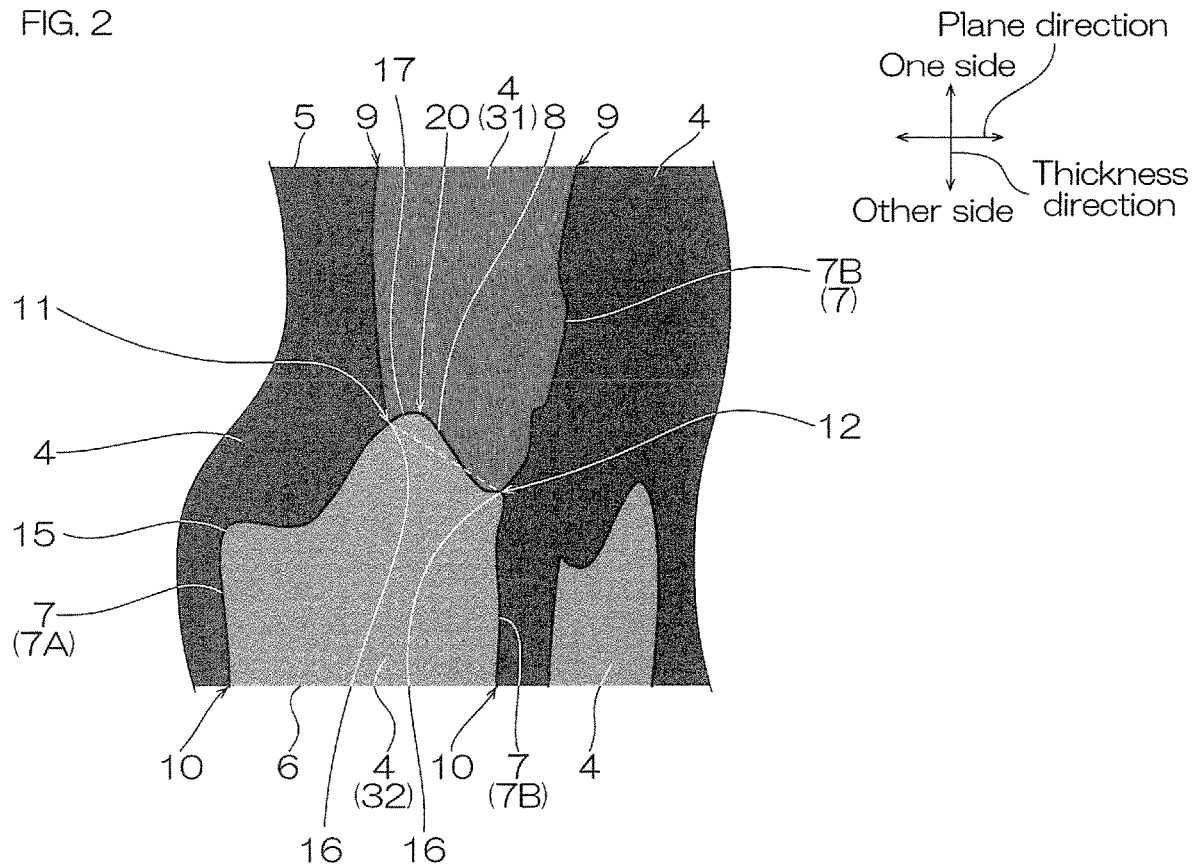
FIG. 2 shows a cross-sectional view of the transparent electroconductive layer in the transparent electroconductive sheet shown in FIG. 1C.

One embodiment of a transparent electroconductive sheet of the present invention is described with reference to FIGS. 1A to 3. In FIG. 2, a plurality of crystal grains 4 (described later) are drawn in grays having different density from each other in order to clearly show the plurality of crystal grains 4, and in order to distinguish a first grain boundary 7 (described later) and a second grain boundary 8 (described later) from a leader line and a phantom line segment (chain line).

As shown in FIG. 1C, a transparent electroconductive sheet 1 has a sheet shape having a predetermined thickness and extending in a plane direction perpendicular to a thickness direction. The transparent electroconductive sheet 1 includes a substrate sheet 2 and a transparent electroconductive layer 3 in order toward one side in the thickness direction.

The substrate sheet 2 is a transparent substrate for ensuring mechanical strength of the transparent electroconductive sheet 1. The substrate sheet 2 extends in the plane direction. The substrate sheet 2 has a substrate first main surface 21 and a substrate second main surface 22. The substrate first main surface 21 is a flat surface. The substrate second main surface 22 is oppositely disposed at spaced intervals to the other side in the thickness direction of the substrate first main surface 21. The substrate sheet 2 is located at the side of a second main surface 6 (described later) of the transparent electroconductive layer 3. The substrate second main surface 22 is parallel to the substrate first main surface 21.

The flat surface is not limited to a flat surface where the substrate first main surface 21 and the substrate second main surface 22 of the substrate sheet 2 are generally parallel. For example, fine irregularities and waviness to the extent that cannot be observed are acceptable.

Examples of a material for the substrate sheet 2 include polyester resins such as polyethylene terephthalate (PET), polybutylene terephthalate, and polyethylene naphthalate; (meth)acrylic resins (acrylic resin and/or methacrylic resin) such as polymethacrylate; olefin resins such as polyethylene, polypropylene, and cycloolefin polymer; polycarbonate resins; polyether sulfone resins; polyarylate resins; melamine resins; poly-amide resins; polyimide resins; cellulose resins; polystyrene resins; and norbornene resins. From the viewpoint of transparency and moisture permeability resistance, preferably, a polyester resin is used, more preferably, PET is used. A thickness of the substrate sheet 2 is, for example, 10 μm or more, and for example, 100 μm or less.

The transparent electroconductive layer 3 is disposed at one side in the thickness direction of the substrate sheet 2. Specifically, the transparent electroconductive layer 3 is in contact with the entire substrate first main surface 21 of the substrate sheet 2. The transparent electroconductive layer 3 is a single layer having a predetermined thickness and extending in the plane direction. Specifically, the transparent electroconductive layer 3 is not a plurality of layers which are laminated in the thickness direction. More specifically, a plurality of transparent electroconductive layers partitioned along the plane direction, and including boundaries parallel to the substrate first main surface 21 of the substrate sheet 2 are not the transparent electroconductive layer of the present invention.

The transparent electroconductive layer 3 includes a first main surface 5 and the second main surface 6.

The first main surface 5 is exposed toward one side in the thickness direction. The first main surface 5 is a flat surface.

The second main surface 6 is oppositely disposed at spaced intervals to the other side in the thickness direction of the first main surface 5. The second main surface 6 is a flat surface parallel to the first main surface 5. In one embodiment, the second main surface 6 is in contact with the substrate first main surface 21.

The flat surface is not limited to a flat surface where the first main surface 5 and the second main surface 6 are generally parallel. For example, fine irregularities and waviness to the extent that cannot be observed are acceptable.

The transparent electroconductive layer 3 is crystalline. Preferably, the transparent electroconductive layer 3 does not include an amorphous region, and includes only a crystalline region in the plane direction. The transparent electroconductive layer including the amorphous region is identified, for example, by observing crystal grains in the plane direction of the transparent electroconductive layer with TEM.

When the transparent electroconductive layer 3 is crystalline, for example, the transparent electroconductive layer 3 is immersed in a hydrochloric acid aqueous solution of 5% by mass at 20° C. for 15 minutes, and thereafter, washed with water and dried. The resistance between two terminals between about 15 mm is measured in the first main surface 5, and the resistance between the two terminals is 10 k$\Omega$ or less. On the other hand, when the above-described resistance between the two terminals is above 10 k$\Omega$, the transparent electroconductive layer 3 is amorphous.

As shown in FIG. 2, the transparent electroconductive layer 3 has the plurality of crystal grains 4. The crystal grains 4 may be also referred to as grains.

The transparent electroconductive layer 3 has the first grain boundary 7 and the second grain boundary 8 which partition the plurality of crystal grains 4.

The first grain boundary 7 extends in the thickness direction, and each of one end edge 9 and another end edge 10 in the thickness direction of the first grain boundary 7 is, in a cross-sectional view, open in each of the first main surface 5 and the second main surface 6. The plurality of first grain boundaries 7 are disposed at spaced intervals to each other in the plane direction. Further, the first grain boundary 7 may include, in a cross-sectional view, a curved portion 15, a bent portion 16, or the like.

The second grain boundary 8 branches from a first intermediate portion 11 in the thickness direction of one first grain boundary 7 (ref: reference numeral 7A), and reaches a second intermediate portion 12 in the thickness direction of another first grain boundary 7 (ref: reference numeral 7B) adjacent to the one first grain boundary 7 of the plurality of first grain boundaries 7. Both the first intermediate portion 11 and the second intermediate portion 12 are, for example, the bent portions 16. The second grain boundary 8 communicates the first intermediate portion 11 to the second intermediate portion 12. Thus, the second grain boundary 8 partitions first crystal grains 31 located at one side in the thickness direction thereof, and second crystal grains 32 located at the other side in the thickness direction thereof in the thickness direction. That is, the first crystal grains 31 and the second crystal grains 32 are disposed in order in the thickness direction by the second grain boundary 8. The first crystal grains 31 include the first main surface 5. The second crystal grains 32 include the second main surface 6.

The second grain boundary 8 includes a second curved portion 17. In this embodiment, the second curved portion 17 has one apex 20.

The apex 20 is located at a position 5 nm or more away from a line segment (dashed line) connecting the first intermediate portion 11 to the second intermediate portion 12. The above-described distance is preferably 10 nm or more. In the present embodiment, a point which has a distance from the line segment of below 5 nm is not included in the apex of the present embodiment.

In one embodiment, the apex 20 is located at one side in the thickness direction with respect to the above-described line segment.

Further, a grain boundary which extends from the one end edge 9 in the thickness direction of the one first grain boundary 7A to the first intermediate portion 11, branches from the first intermediate portion 11 to the second grain boundary 8, reaches from the second intermediate portion 12 to the other first grain boundary 7B, and subsequently, reaches the other end edge 10 in the thickness direction is not the first grain boundary of the present invention. That is, the grain boundary which reaches the other grain boundary 7B from the one first grain boundary 7A via the second grain boundary 8 is not the first grain boundary of the present invention.

On the other hand, a grain boundary which extends from the one end edge 9 in the thickness direction of the one first grain boundary 7 (ref: reference numeral 7A) to the first intermediate portion 11, and branches from the first intermediate portion 11 into plural, and in which each of the plurality of first grain boundaries 7 reaches the other end edge 10 in the thickness direction is included in the first grain boundary of the present invention. That is, the first grain boundary 7 without passing through the second grain boundary 8 is included in the first grain boundary of the present invention.

The material for the transparent electroconductive layer 3 is not particularly limited. An example of the material for the transparent electroconductive layer 3 includes a metal oxide containing at least one kind of metal selected from the group consisting of In, Sn, Zn, Ga, Sb, Nb, Ti, Si, Zr, Mg, Al, Au, Ag, Cu, Pd, and W Specifically, preferably, metal oxides such as indium-zinc composite oxide (IZO), indium-gallium-zinc composite oxide (IGZO), indium-gallium composite oxide (IGO), indium-tin composite oxide (ITO), and antimony-tin composite oxide (ATO) are used, preferably, tin-containing oxides such as indium-tin composite oxide (ITO) and antimony-tin composite oxide (ATO) are used. When the material for the transparent electroconductive layer 3 is the tin-containing oxide, it has excellent transparency and electrical conductivity.

The tin oxide ($SnO_2$) content of the transparent electroconductive layer 3 (tin-containing oxide) is not particularly limited, and is, for example, 0.5% by mass or more, preferably 3% by mass or more, more preferably 6% by mass or more, and for example, below 50% by mass, preferably 25% by mass or less, more preferably 15% by mass or less.

The thickness of the transparent electroconductive layer 3 is, for example, 10 nm or more, preferably 30 nm or more, more preferably 70 nm or more, further more preferably 100 nm or more, particularly preferably 120 nm or more, most preferably 140 nm or more, and for example, 300 nm or less, preferably 200 nm or less. A method for determining the thickness of the transparent electroconductive layer 3 is described in detail in Examples later.

When the thickness of the transparent electroconductive layer 3 is the above-described lower limit or more, the transparent electroconductive layer 3 has excellent moisture permeability resistance.

When the thickness of the transparent electroconductive layer 3 is the above-described upper limit or less, the transparent electroconductive layer 3 is thinned.

For example, a ratio of an average of a path of the one end edge 9 and the other end edge 10 in the thickness direction of the first grain boundary 7 to the thickness of the transparent electroconductive layer 3 is, in a cross-sectional view, for example, above 1, preferably 1.1 or more, more preferably 1.2 or more, further more preferably 1.5 or more, and for example, 5 or less, preferably 2.5 or less. Further, the ratio of the average of the path of the first intermediate portion 11 and the second intermediate portion 12 of the second grain boundary 8 to the average of the path of the one end edge 9 and the other end edge 10 in the thickness direction of the first grain boundary 7 is, in a cross-sectional view, for example, 0.1 or more, preferably 0.3 or more, and for example, 5 or less, preferably 3 or less. When the above-described ratio is above the above-described lower limit and below the above-described upper limit, it is possible to improve the moisture permeability resistance of the transparent electroconductive layer 3.

The moisture permeability at a temperature of 40° C. and relative humidity of 90% of the transparent electroconductive layer 3 is $10^{-1}$ [g/m$^2$·24 h] or less, preferably $10^{-2}$ [g/m$^2$·24 h] or less, more preferably $10^{-3}$ [g/m$^2$·24 h] or less, further more preferably $10^{-4}$ [g/m$^2$·24 h] or less, even more preferably $10^{-5}$ [g/m$^2$·24 h] or less, and for example, above 0 [g/m$^2$·24 h]. When the moisture permeability of the transparent electroconductive layer 3 is the above-described upper limit or less, the transparent electroconductive layer 3 has excellent moisture permeability resistance. The moisture permeability of the transparent electroconductive layer 3 is described in an evaluation method of Examples to be described later.

The surface resistance of the transparent electroconductive layer 3 is, for example, 200Ω/□ or less, preferably 50Ω/□ or less, more preferably 30Ω/□ or less, further more preferably 20Ω/□ or less, particularly preferably 17Ω/□ or less, and for example, above 0 Ω/□.

A specific resistance value of the transparent electroconductive layer 3 is, for example, $3.5 \times 10^{-4}$ Ωcm or less, preferably $3.0 \times 10^{-4}$ Ωcm or less, more preferably $2.8 \times 10^{-4}$ Ωcm or less, further more preferably $2.5 \times 10^{-4}$ Ωcm or less, and for example, $0.5 \times 10^{-4}$ Ωcm or more. The specific resistance value can be obtained by multiplying the thickness of the transparent electroconductive layer 3 by the value of the surface resistance thereof.

Next, a method for producing the transparent electroconductive sheet 1 is described.

In this method, for example, the transparent electroconductive layer 3 is formed, while the substrate sheet 2 is conveyed by a roll-to-roll method.

As shown in FIG. 1A, specifically, first, the substrate sheet 2 is prepared.

As shown in FIG. 1C, next, the transparent electroconductive layer 3 is formed on the substrate first main surface 21 of the substrate sheet 2. The transparent electroconductive layer 3 is, for example, formed by a dry method such as sputtering and by a wet method such as plating. The transparent electroconductive layer 3 is formed preferably by a dry method, more preferably by sputtering.

Figure 3:
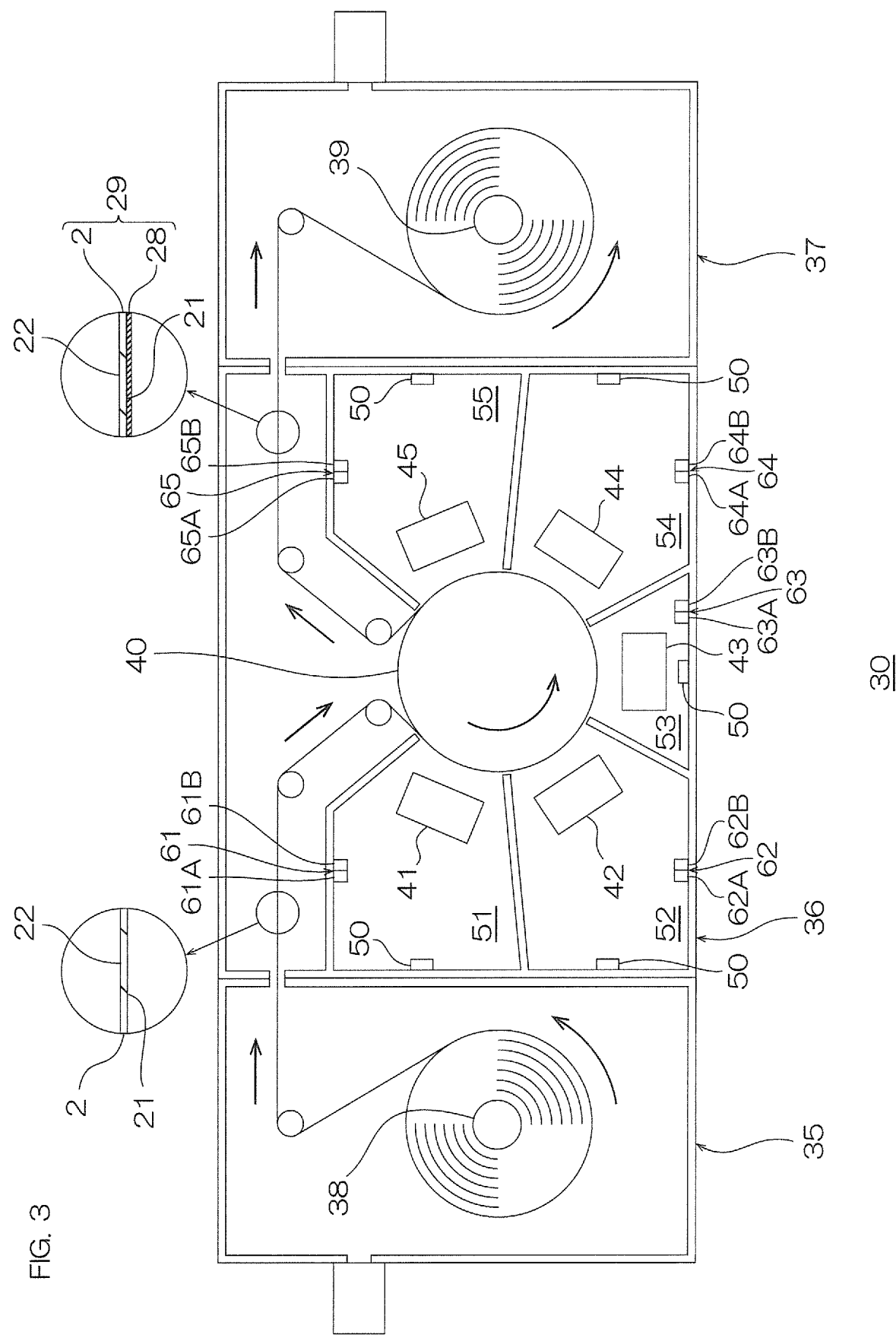
FIG. 3 shows a schematic view of a sputtering device used in the step of forming the amorphous transparent electroconductive layer shown in FIG. 1B.

A method for producing the transparent electroconductive layer 3 is not particularly limited. For example, an amorphous transparent electroconductive layer 28 shown in FIG. 1B is formed using a sputtering device 30 (ref: FIG. 3) including a plurality of targets 41 to 45, and thereafter, the amorphous transparent electroconductive layer 28 is heated.

As shown in FIG. 3, the sputtering device 30 includes a feeding portion 35, a sputtering portion 36, and a take-up portion 37 in order from an upstream side toward a downstream side in a conveying direction of the substrate sheet 2.

The feeding portion 35 includes a feeding roll 38.

The sputtering portion 36 includes a film-forming roll 40 and the plurality of targets 41 to 45.

The plurality of targets 41 to 45 consist of the first target 41, the second target 42, the third target 43, the fourth target 44, and the fifth target 45. The first target 41 to the fifth target 45 are disposed in order along a circumferential direction of the film-forming roll 40.

As the material for the target, the same material as that of the above-described transparent electroconductive layer 3 is used.

Also, the above-described tin oxide content in the plurality of targets 41 to 45 is the same or different.

Each of the plurality of targets 41 to 45 is housed in each of a plurality of film-forming chambers 51 to 55.

The plurality of film-forming chambers 51 to 55 consist of the first film-forming chamber 51, the second film-forming chamber 52, the third film-forming chamber 53, the fourth film-forming chamber 54, and the fifth film-forming chamber 55. The first film-forming chamber 51 to the fifth film-forming chamber 55 are disposed adjacent to each other along the circumferential direction.

Each of the plurality of film-forming chambers 51 to 55 is provided with each of a plurality of gas feeders 61 to 65. The plurality of gas feeders 61 to 65 correspond to the respective plurality of targets 41 to 45. The plurality of gas feeders 61 to 65 consist of the first gas feeder 61, the second gas feeder 62, the third gas feeder 63, the fourth gas feeder 64, and the fifth gas feeder 65. Each of the plurality of gas feeders 61 to 65 is capable of supplying a sputtering gas to each of the plurality of film-forming chambers 51 to 55.

Specifically, each of the plurality of gas feeders 61 to 65 includes each of inert gas feeders 61A to 65A and each of oxygen gas feeders 61B to 65B.

The inert gas feeders 61A to 65A consist of the first inert gas feeder 61A, the second inert gas feeder 62A, the third inert gas feeder 63A, the fourth inert gas feeder 64A, and the fifth inert gas feeder 65A. The first inert gas feeder 61A to the fifth inert gas feeder 65A are capable of supplying an inert gas to the film-forming chambers 51 to 55, respectively.

The oxygen gas feeders 61B to 65B consist of the first oxygen gas feeder 61B, the second oxygen gas feeder 62B, the third oxygen gas feeder 63B, the fourth oxygen gas feeder 64B, and the fifth oxygen gas feeder 65B. The first oxygen gas feeder 61B to the fifth oxygen gas feeder 65B are capable of supplying an oxygen gas to the film-forming chambers 51 to 55, respectively.

In addition, a pump 50 which is capable of reducing the pressure of each of the plurality of film-forming chambers 51 to 55 is provided in each of the plurality of film-forming chambers 51 to 55.

The take-up portion 37 includes a take-up roll 39.

The sputtering device 30 is not particularly limited as long as it includes, for example, the plurality of targets 41 to 45, and an example thereof includes the sputtering device described in Japanese Unexamined Patent Publication No. 2015-74810 or the like.

In order to form (sputter) the amorphous transparent electroconductive layer 28 on the substrate first main surface 21 of the substrate sheet 2 using the sputtering device 30, first, the substrate sheet 2 is bridged over the feeding roll 38, the film-forming roll 40, and the take-up roll 39.

Subsequently, the plurality of pumps 50 are driven to bring the first film-forming chamber 51 to the fifth film-forming chamber 55 into a vacuum state, and the sputtering gas is supplied from each of the first gas feeder 61 to the fifth gas feeder 65 to each of the first film-forming chamber 51 to the fifth film-forming chamber 55.

Examples of the sputtering gas include inert gases such as Ar and reactive gases, and preferably, reactive gases are used. The reactive gas is preferably a mixed gas of the inert gas and the oxygen gas.

The ratio (oxygen gas flow rate/inert gas flow rate) of the oxygen gas flow rate (mL/min) to the inert gas flow rate (mL/min) is, for example, 0.0001 or more, preferably 0.001 or more, and for example, below 0.5, preferably 0.1 or less.

In the sputtering gas supplied from the plurality of gas feeders 61 to 65, the ratio (oxygen gas flow rate/inert gas flow rate) of the oxygen gas flow rate (mL/min) to the inert gas flow rate (mL/min) is the same or different. Preferably, the oxygen flow ratio in the reactive gas supplied from the plurality of gas feeders 61 to 65 is different.

Specifically, for example, the following formula (1) is satisfied, and preferably, the following formula (2) is satisfied.

$$R2 > R3 > R4 > R5 \quad (1)$$

$$R1 < R2 \quad (2)$$

In the formula, $R1$ is the ratio of the oxygen gas flow rate supplied from the first gas feeder 61. $R2$ is the ratio of the oxygen gas flow rate supplied from the second gas feeder 62. $R3$ is the ratio of the oxygen gas flow rate supplied from the third gas feeder 63. $R4$ is the ratio of the oxygen gas flow rate supplied from the fourth gas feeder 64. $R5$ is the ratio of the oxygen gas flow rate supplied from the fifth gas feeder 65.

However, when the amorphous transparent electroconductive layer 28 is converted into the transparent electroconductive layer 3 by heating in the atmosphere, it starts crystallization from the first main surface 5 toward the second main surface 6, while taking in the oxygen gas in the air. Then, when the formula (1) is satisfied, since the oxygen content is relatively low in the region close to the first main surface 5, and the oxygen content is relatively high in the region close to the second main surface 6, the crystallization proceeds in the two regions. Specifically, in the amorphous transparent electroconductive layer 28, the region close to the first main surface 5 is crystallized along with oxidation under the atmosphere, thereby forming the crystal grains 4. Further, in the region close to the second main surface 6, though the oxygen gas in the atmosphere is hardly supplied, since the oxygen gas flow rate during the sputtering is relatively large, and an amount of oxygen contained in the layer is sufficient, the crystallization occurs by heating, thereby forming the crystal grains 4. As a result, the plurality of crystal grains 4 are formed, and it is possible to reliably form the second grain boundary 8.

When the formula (2) is satisfied, it is possible to reliably crystallize a first region 71 (region in the vicinity of the substrate first main surface 21) (described later) in the amorphous transparent electroconductive layer 28.

However, a gas (including oxygen) released from the substrate sheet 2 is mixed into the first region 71 during the sputtering. When the formula (2) is not satisfied, that is, in the case of $R1 \geq R2$, the amount of oxygen contained in the first region 71 becomes excessive, and as a result, the first region 71 may not be crystallized.

However, when the formula (2) is satisfied, even when the oxygen released from the substrate sheet 2 is mixed into the first region 71, it is possible to suppress an excess of the amount of oxygen of the first region 71, and therefore, it is possible to reliably crystalize the first region 71. The ratio ($R1/R2$) of $R1$ to $R2$ is preferably 0.95 or less, preferably 0.9 or less, more preferably 0.8 or less, further more preferably 0.7 or less, and for example, 0.1 or more, preferably 0.3 or more, more preferably 0.5 or more.

Subsequently, by driving the take-up roll 39, the substrate sheet 2 is fed from the feeding roll 38.

Further, in the vicinity of each of the first target 41 to the fifth target 45, an ionized gas is produced by ionizing the sputtering gas. Subsequently, the ionized gas impinges on each of the first target 41 to the fifth target 45, the target material of each of the first target 41 to the fifth target 45 is ejected, and these target materials adhere to the substrate sheet 2.

The target material of the first target 41 adheres to the substrate first main surface 21 of the substrate sheet 2, next, the target material of the second target 42 adheres thereto, next, the target material of the third target 43 adheres thereto, next, the target material of the fourth target 44 adheres thereto, and next, the target material of the fifth target 45 adheres thereto. That is, the target materials of the first target 41 to the fifth target 45 are deposited in order on the substrate first main surface 21 of the substrate sheet 2.

Thus, the amorphous transparent electroconductive layer 28 is formed on the substrate first main surface 21. Thus, an amorphous transparent electroconductive sheet 29 including the substrate sheet 2 and the amorphous transparent electroconductive layer 28 is obtained.

As shown by an enlarged view of FIG. 1B, the amorphous transparent electroconductive layer 28 includes the first region 71 made of the target material of the first target 41, a second region 72 made of the target material of the second target 42, a third region 73 made of the target material of the third target 43, a fourth region 74 made of the target material of the fourth target 44, and a fifth region 75 made of the target material of the fifth target 45 in order toward one side in the thickness direction.

In the enlarged view of FIG. 1B, in order to clearly show the relative arrangement of the first region 71 to the fifth region 75 adjacent to each other, their boundaries are shown. However, in the amorphous transparent electroconductive layer 28, the boundaries may not be clearly observed.

Next, the amorphous transparent electroconductive layer 28 is crystallized, thereby forming the crystalline transparent electroconductive layer 3.

In order to crystallize the amorphous transparent electroconductive layer 28, for example, the amorphous transparent electroconductive layer 28 is heated.

The heating conditions are not particularly limited. A heating temperature is, for example, 90° C. or more, preferably 110° C. or more, and for example, below 200° C., preferably 180° C. or less, more preferably 170° C. or less, further more preferably 165° C. or less. The heating time is, for example, 1 minute or more, preferably 3 minutes or more, more preferably 5 minutes or more, and for example, 5 hours or less, preferably 3 hours or less, more preferably 2 hours or less.

Also, the heating is carried out, for example, under an atmospheric atmosphere.

Thus, the amorphous transparent electroconductive layer 28 is converted into the transparent electroconductive layer 3 having the plurality of crystal grains 4, the first grain boundary 7, and the second grain boundary 8.

Thus, the transparent electroconductive sheet 1 including the substrate sheet 2 and the transparent electroconductive layer 3 is obtained.

The transparent electroconductive sheet 1 is used for various applications, for example, for touch sensors, electromagnetic wave shields, light control elements (voltage-driven light control elements such as PDLC and SPD, and current-driven light control elements such as electrochromic (EC)), photoelectric conversion elements (electrodes of solar cell elements represented by organic thin-film solar cells or dye-sensitized solar cells etc.), heat ray control members (near-infrared reflection and/or absorbing members or far-infrared reflection and/or absorbing members), antenna members (light-transmitting antennas), image display devices, or the like.

In the light control element, the first main surface 5 is disposed adjacent to a light control functional layer, and the substrate second main surface 22 of the substrate sheet 2 is exposed to the outside air.

In the solar cell element, the first main surface 5 is disposed adjacent to a cell 18, and the substrate second main surface 22 is exposed to the outside air.

In both the light control element and the solar cell element, the second main surface 6 of the transparent electroconductive layer 3 faces the outside air through the substrate sheet 2.

(Function and Effect of One Embodiment) The transparent electroconductive layer 3 has the second grain boundary 8 which branches from the first intermediate portion 11 of the one first grain boundary 7A and reaches the second intermediate portion 12 of the other first grain boundary 7B. Therefore, even when water is brought into contact with the second main surface 6, it is possible to secure a long path of water reaching from the second main surface 6 to the first main surface 5. As a result, the transparent electroconductive layer 3 has excellent moisture permeability resistance. Further, the transparent electroconductive sheet 1 including the transparent electroconductive layer 3 also has excellent moisture permeability resistance.

Specifically, when the transparent electroconductive sheet 1 is used for the electrode of the light control element or the solar cell element, even when the substrate second main surface 22 is exposed to the outside air containing moisture, the transparent electroconductive layer 3 includes the second grain boundary 8, so that a water intrusion path from the second main surface 6 to the first main surface 5 becomes long, and the arrival of the water to the first main surface 5 can be delayed. Therefore, it is possible to delay damage to the light control layer or the cell 18 due to the water intrusion. That is, it is possible to constitute the light control element or the solar cell element having excellent humidity resistance.

(Modified Examples) In each modified example below, the same reference numerals are provided for members and steps corresponding to each of those in the above-described one embodiment, and their detailed description is omitted. Each modified example can achieve the same function and effect as that of one embodiment unless otherwise specified. Furthermore, one embodiment and the modified example thereof can be appropriately used in combination.

In the above-described sputtering device 30, the number of the plurality of targets 41 to 45, the number of the plurality of film-forming chambers 51 to 55, and the number of the plurality of gas feeders 61 to 65 are 5. However, the number is not particularly limited as long as it is, for example, 2 or more, and preferably, the number is 4 or more.

When the number of the plurality of targets, the number of the plurality of film-forming chambers, and, the number of the plurality of gas feeders are 4 or more, the plurality of gas feeders include at least the first gas feeder 61 to the fourth gas feeder 64 in order toward the downstream side in the conveying direction. Then, in the step of forming the amorphous transparent electroconductive layer 28, the ratio of the oxygen gas flow rate to the inert gas flow rate supplied from the second gas feeder 62 is set higher than the ratio of the oxygen gas flow rate to the inert gas flow rate supplied from the third gas feeder 63, and the ratio of the oxygen gas flow rate to the inert gas flow rate supplied from the third gas feeder 63 is set higher than the ratio of the oxygen gas flow rate to the inert gas flow rate supplied from the fourth gas feeder 64. In this method, in the amorphous transparent electroconductive layer 28, in the region close to the first main surface 5, the oxygen content is relatively low, and in the region close to the second main surface 6, the oxygen content is relatively high, so that the crystallization proceeds in each of the two regions. Specifically, in the amorphous transparent electroconductive layer 28, each of the region close to the first main surface 5 and the region close to the second main surface 6 is crystallized. As a result, it is possible to reliably form the second grain boundary 8.

When the number of each of the target, the film-forming chamber, and the gas feeder is 1, the amorphous transparent electroconductive layer 28 can be formed a plurality of times. In that case, for example, in the case of formation of five times, it is preferable to adjust an oxygen introduction amount of the first region 71, the second region 72, the third region 73, the fourth region 74, and the fifth region 75. Specifically, in the region close to the first main surface 5, the oxygen content is relatively low, and in the region close to the second main surface 6, by introducing the oxygen content relatively high, in the two regions, the crystallization proceeds, and it is possible to reliably form the second grain boundary 8.

Although not shown, the apex 20 may be also located on the other side in the thickness direction with respect to the line segment shown by the dashed line.

Figure 4:
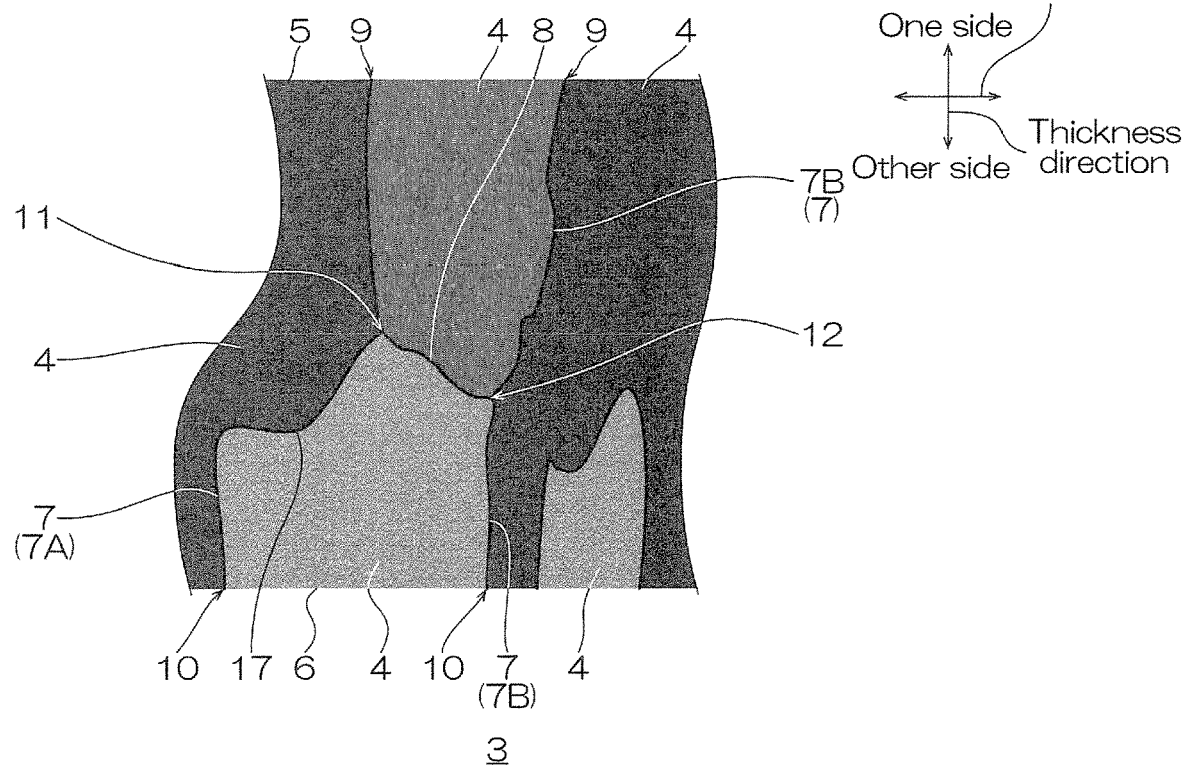
FIG. 4 shows a cross-sectional view of a modified example (modified example in which a second grain boundary does not have an apex) of a transparent electroconductive layer of the present invention.

As shown in FIG. 4, the second grain boundary 8 may not have the apex 20.

Preferably, as in one embodiment, the second grain boundary 8 has the apex 20. Thus, it is possible to make the path of water passing through the second grain boundary 8 having the apex 20 further longer. Therefore, the moisture permeability resistance of the transparent electroconductive layer 3 is more excellent.

Figure 5:
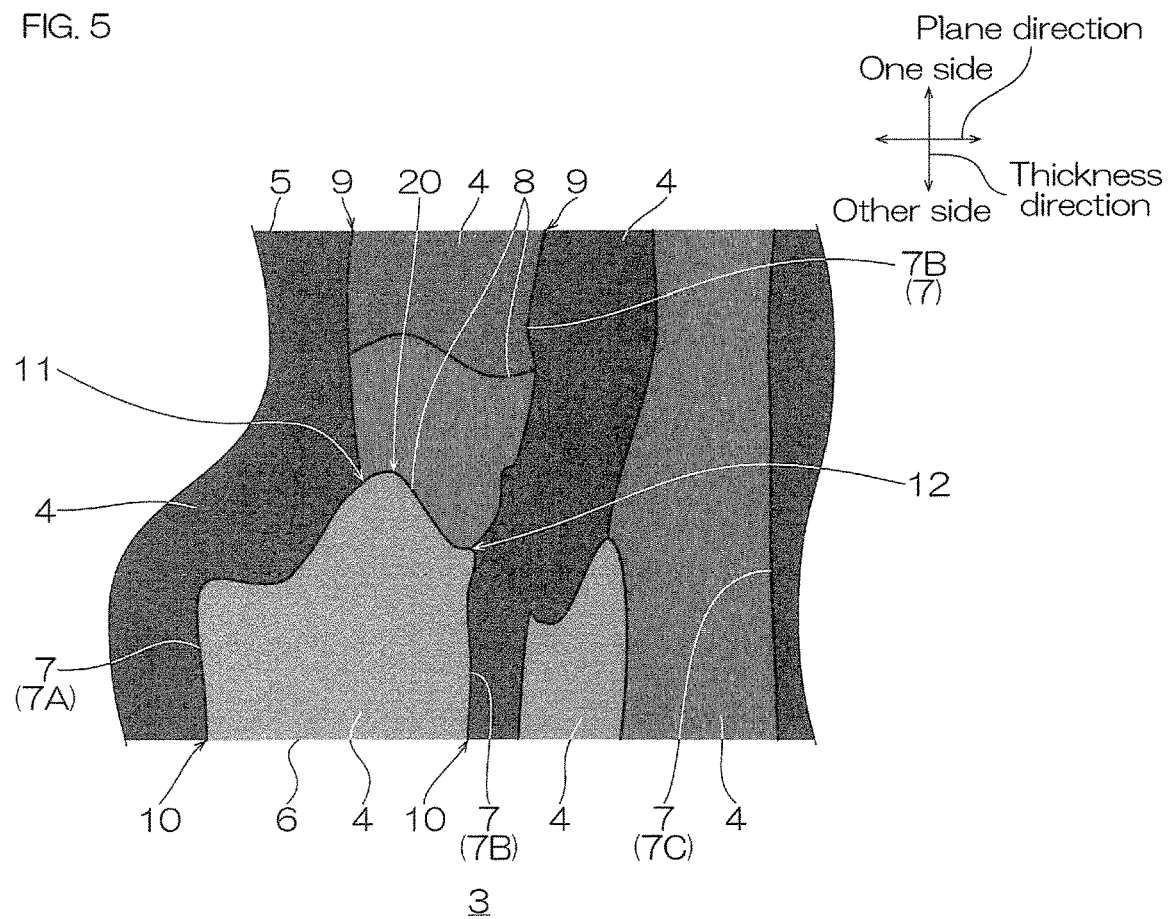
FIG. 5 shows a cross-sectional view of a modified example (modified example including a plurality of second grain boundaries arranged in a thickness direction) of a transparent electroconductive layer of the present invention.

As shown in FIG. 5, in the modified example, the transparent electroconductive layer 3 includes the plurality of second grain boundaries 8 which are overlapped with each other when projected in the thickness direction.

Further, as shown in FIG. 5, the first grain boundary 7 may also include a non-contact first grain boundary 7C which is not in contact with the second grain boundary 8 in a cross-sectional view.

Figure 6:
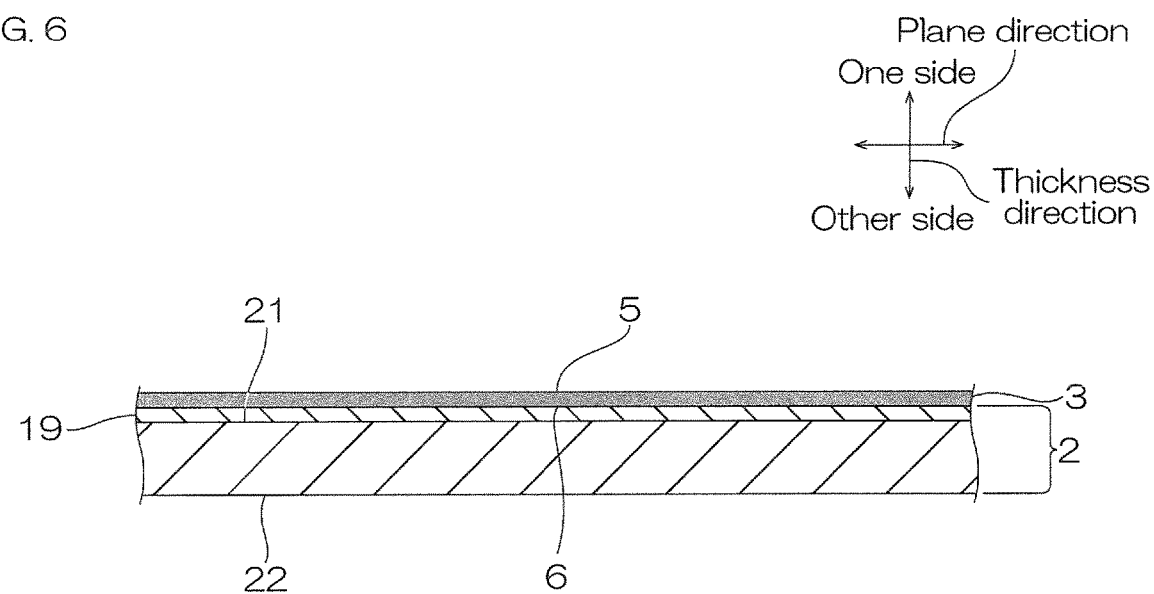
FIG. 6 shows a cross-sectional view of a modified example (modified example including a functional layer) of a transparent electroconductive sheet of the present invention.

As shown in FIG. 6, the substrate sheet 2 of the transparent electroconductive sheet 1 may further include a functional layer 19 disposed on one surface thereof. The functional layer 19 is included in the substrate sheet 2. Examples of the functional layer 19 include anti-blocking layers, optical adjustment layers, and hard coat layers. The functional layer 19 is a single layer or a plurality of layers. The functional layer 19 may include any of inorganic materials, organic materials, and composite materials of organic materials and inorganic materials as a constituent material.

In the sputtering device 30, though not shown, it is also possible to use a flat film-forming plate extending in the plane direction instead of the film-forming roll 40. The first target 41 to the fifth target 45 are disposed in alignment on a straight line at spaced intervals to the film-forming plate.

EXAMPLES

Next, the present invention is further described based on Example and Comparative Example below. The present invention is however not limited by Example and Comparative Example. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Example 1

First, a PET film roll (manufactured by Mitsubishi Plastics, Inc., thickness of 50 μm) was prepared.

Then, an ultraviolet curable resin made of an acrylic resin was applied to the upper surface of the PET film roll and cured by ultraviolet irradiation, thereby forming a functional layer consisting of a cured resin layer and having a thickness of 2 μm. Thus, as shown in FIG. 6, the substrate sheet 2 including the transparent substrate and the functional layer 19 was obtained.

Thereafter, the transparent electroconductive layer 3 having a thickness of 144 nm was formed on the substrate first main surface 21 of the substrate sheet 2 by sputtering.

Specifically, first, the sputtering device 30 including the first target 41 to the fifth target 45 made of ITO having the tin oxide concentration of 10% by weight was prepared, and the substrate sheet 2 was bridged over the feeding roll 38, the film-forming roll 40, and the take-up roll 39 of the sputtering device 30.

Subsequently, the plurality of pumps 50 were driven to bring the first film-forming chamber 51 to the fifth film-forming chamber 55 into a vacuum state (under a reduced pressure atmosphere) of 0.4 Pa, and a reactive gas was supplied from each of the first gas feeder 61 to the fifth gas feeder 65 to each of the first film-forming chamber 51 to the fifth film-forming chamber 55 at the flow ratio (oxygen gas flow rate/argon gas flow rate) described in Table 1.

Further, by driving the take-up roll 39, the substrate sheet 2 was fed from the feeding roll 38.

Then, the sputtering was carried out in each of the first film-forming chamber 51 to the fifth film-forming chamber 55.

Thus, the amorphous transparent electroconductive layer 28 having the first region 71 to the fifth region 75 was formed on the substrate first main surface 21 (one surface of the functional layer 19) of the substrate sheet 2. Thus, the amorphous transparent electroconductive sheet 29 including the substrate sheet 2 and the amorphous transparent electroconductive layer 28 was obtained.

Thereafter, the amorphous transparent electroconductive sheet 29 was heated at 165° C. for 120 minutes under an atmospheric atmosphere, thereby crystallizing the transparent electroconductive layer 3 (the amorphous transparent electroconductive layer 28). Thus, the transparent electroconductive sheet 1 including the substrate sheet 2 and the transparent electroconductive layer 3 was produced.

Comparative Example 1

The process was carried out in the same manner as in Example 1, except that the film-forming conditions and the thickness of the transparent electroconductive layer 3 were changed in accordance with the description of Table 1.

EVALUATION

The following items were evaluated. The results are shown in Table 1.

[Thickness of Transparent Electroconductive Layer]

The thickness of the transparent electroconductive layer 3 was determined by cross-sectional observation using a transmission electron microscope (manufactured by Hitachi, Ltd., device name: "HF-2000").

[Cross-Sectional Observation of Crystal Grain]

After the transparent electroconductive sheet 1 of each of the transparent electroconductive layers 3 of Example 1 and Comparative Example 1 was cross-sectionally adjusted by an FIB micro-sampling method, the cross-section of each of the transparent electroconductive layers 3 was subjected to FE-TEM observation. The magnification was set so that at least the first grain boundary 7 could be observed.

The device and the measurement conditions are as follows.

FIB device: FB2200 manufactured by Hitachi, Ltd., acceleration voltage: 10 kV

FE-TEM device: JEM-2800 manufactured by JEOL Ltd., acceleration voltage: 200 kV

[Surface Resistance of Transparent Electroconductive Layer]

The surface resistance of each of the transparent electroconductive layers 3 of Example 1 and Comparative Example 1 was measured by a four-terminal method.

[Moisture Permeability of Transparent Electroconductive Layer]

The moisture permeability of each of the transparent electroconductive layers 3 of Example 1 and Comparative Example 1 was measured under the conditions of a temperature of 40° C. and relative humidity of 90% using a water vapor permeability measuring device ("PERMATRAN W3/33", manufactured by AMETEK MOCON). The substrate second main surface 22 of the substrate sheet 2 was disposed on the side of a detector during the measurement.

TABLE 1

| | | Sputtering Conditions | | Crystalline Transparent Electroconductive Layer | | | |
|---|---|---|---|---|---|---|---|
| Ex. Comparative Ex. | First to Fifth | Tin Oxide Content in Target Material (% by mass) | Flow Ratio of Sputtering Gas ($O_2$ Flow Rate/Ar Flow Rate) | Thickness (nm) | Presence or Absence of Second Grain Boundary | Surface Resistance Value ($\Omega/\square$) | Moisture Permeability ($g/m^2 \cdot 24$ h) |
| Ex. 1 | First | 10 | 0.008 | 144 | Presence | 17 | below $5 \times 10^{-4}$ |
| | Second | 10 | 0.013 | | | | |
| | Third | 10 | 0.007 | | | | |
| | Fourth | 10 | 0.005 | | | | |
| | Fifth | 10 | 0.002 | | | | |
| Comparative Ex. 1 | First | 10 | 0.005 | 32 | Absence | 70 | $4 \times 10^{-1}$ |
| | Second | 10 | 0.007 | | | | |
| | Third | 10 | 0.008 | | | | |
| | Fourth | 10 | 0.006 | | | | |
| | Fifth | 3 | 0.006 | | | | |

The transparent electroconductive layer 3 of Example 1 including the second grain boundary 8 has lower moisture permeability than the transparent electroconductive layer 3 of Comparative Example 1 having no second grain boundary 8. In general, the moisture permeability is inversely proportional to the thickness of the film through which water permeates (in the present application, the thickness of the transparent electroconductive layer 3). Then, when a value was obtained by dividing the moisture permeability of Example 1 and Comparative Example 1 by the thickness of each Example, the value in Example 1 is below $3.47 \times 10^{-6}$, and the value in Comparative Example 1 is $1.25 \times 10^{-2}$. Each of the above-described units is $(g/cm^2 \cdot 24$ h$)/$nm. This result suggests that the moisture permeability of the transparent electroconductive layer 3 of Example 1 is at a level lower than the moisture permeability of Comparative Example 1 even when the factor of the thickness is excluded.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The transparent electroconductive layer of the present invention is, for example, used for a transparent electroconductive sheet, a touch sensor, a light control element, a photoelectric conversion element, a heat ray control member, an antenna, an electromagnetic wave shield member, and an image display device.

DESCRIPTION OF REFERENCE NUMERALS

1 Transparent electroconductive sheet
3 Transparent electroconductive layer
2 Substrate sheet
4 Crystal grain
5 First main surface
6 Second main surface
7 First grain boundary
8 Second grain boundary
9 Apex
11 First intermediate portion
12 Second intermediate portion

The invention claimed is:

1. A transparent electroconductive layer comprising:
a first main surface and a second main surface facing each other in a thickness direction; being a single layer extending in a plane direction perpendicular to the thickness direction; and
having a plurality of crystal grains,
a plurality of first grain boundaries partitioning the plurality of crystal grains and having each of one end edge and another end edge in the thickness direction open in each of the first main surface and the second main surface, and
a second grain boundary branching from an intermediate portion in the thickness direction of one first grain boundary and reaching an intermediate portion in the thickness direction of another first grain boundary adjacent to the one first grain boundary,
wherein the second grain boundary has, in a cross-sectional view, an apex located at a position 5 nm or more away from a line segment connecting the intermediate portion in the thickness direction of the one first grain boundary to the intermediate portion in the thickness direction of the other first grain boundary.

2. The transparent electroconductive layer according to claim 1, wherein a material is a tin-containing oxide.

3. The transparent electroconductive layer according to claim 1 having a thickness of 100 nm or more.

4. A transparent electroconductive sheet comprising:
the transparent electroconductive layer according to claim 1 and
a substrate sheet located at the side of a second main surface of the transparent electroconductive layer.

5. A touch sensor comprising:
the transparent electroconductive layer according to claim 1.

6. A light control element comprising:
the transparent electroconductive layer according to claim 1.

7. A photoelectric conversion element comprising:
the transparent electroconductive layer according to claim 1.

8. A heat ray control member comprising:
the transparent electroconductive layer according to claim 1.

9. An antenna comprising:
the transparent electroconductive layer according to claim 1.

10. An electromagnetic wave shield member comprising:
the transparent electroconductive layer according to claim 1.

11. An image display device comprising:
the transparent electroconductive layer according to claim 1.

* * * * *